United States Patent
Hara et al.

(10) Patent No.: US 6,686,969 B1
(45) Date of Patent: Feb. 3, 2004

(54) DISPLAY DEVICE

(75) Inventors: Kouichirou Hara, Osaka (JP); Yasuo Murakami, Tokyo (JP)

(73) Assignee: NEC-Mitsubishi Electric Visual Systems Corporation, Tokyo (JP)

(*) Notice: Subject to any disclaimer, the term of this patent is extended or adjusted under 35 U.S.C. 154(b) by 406 days.

(21) Appl. No.: 09/645,435

(22) Filed: Aug. 25, 2000

(30) Foreign Application Priority Data

Mar. 2, 2000 (JP) ..................................... P2000-056715

(51) Int. Cl.[7] .................................................. H04N 5/06
(52) U.S. Cl. .................................... 348/537; 348/571
(58) Field of Search .............................. 348/497, 536, 348/537; 345/691

(56) References Cited

U.S. PATENT DOCUMENTS

| | | | | |
|---|---|---|---|---|
| 5,298,998 A | * | 3/1994 | Furumiya et al. | 348/537 |
| 5,990,968 A | * | 11/1999 | Naka et al. | 348/537 |
| 6,115,075 A | * | 9/2000 | Yoneno | 348/537 |
| 6,323,910 B1 | * | 11/2001 | Clark, III | 348/537 |

FOREIGN PATENT DOCUMENTS

| | | |
|---|---|---|
| JP | 10133619 | 5/1998 |
| JP | 10260653 | 9/1998 |
| JP | 11177847 | 7/1999 |

* cited by examiner

*Primary Examiner*—Matthew Luu
(74) *Attorney, Agent, or Firm*—Birch, Stewart, Kolasch & Birch, LLP

(57) ABSTRACT

An object is to eliminate the effect of jitter in a sampling clock to realize proper sampling of a video signal. An A/D converter (1) samples a video signal in synchronization with a sampling clock (VCLK) at a rate of a period which is ½ times the video period. The phase of the sampling clock (VCLK) is corrected in a phase correcting circuit (9). The sampled signals are held alternately as data (DL) and (DR) in two latches (14) (15). A data switching portion (16) selects output signals from one of the two latches (14) and (15). A calculating portion (21) calculates an absolute difference value (ΔD) between the data (DL) and (DR) in each video period. A calculating portion (22) calculates a maximum value (Dmax) among the absolute difference values (ΔD) in one frame. A phrase control portion (19) controls the phase correcting circuit (9) and the data switching portion (16) so that a video signal processing circuit (2) can receive sampled signals which are sampled signals which are sampled at a phase corresponding to the center of a rising transition which the maximum value (Dmax) makes as the phase varies.

8 Claims, 11 Drawing Sheets

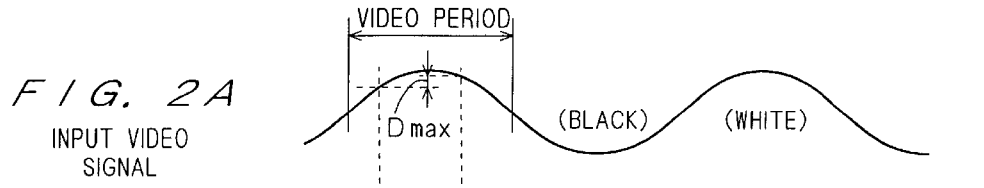
FIG. 2A
INPUT VIDEO
SIGNAL
FIG. 2B
VCLK
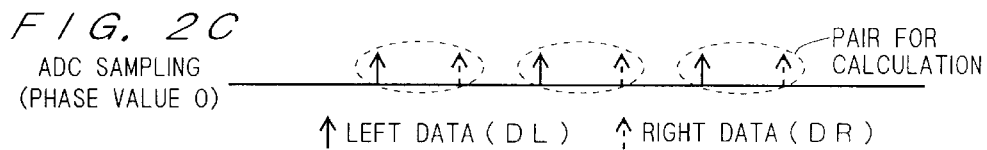
FIG. 2C
ADC SAMPLING
(PHASE VALUE 0)
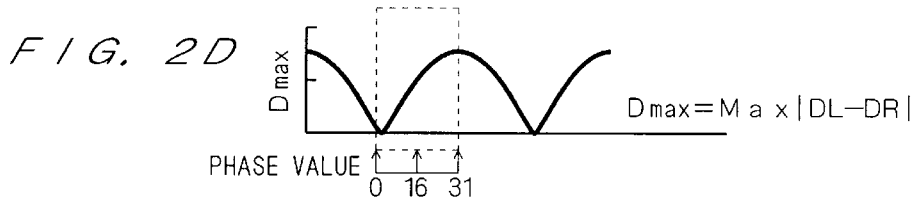
FIG. 2D
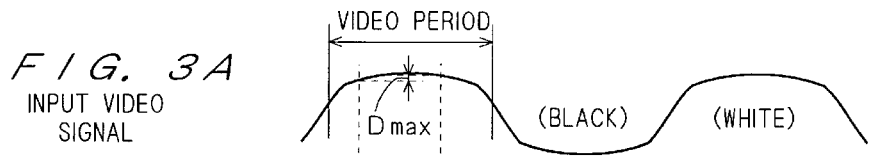
FIG. 3A
INPUT VIDEO
SIGNAL
FIG. 3B
VCLK
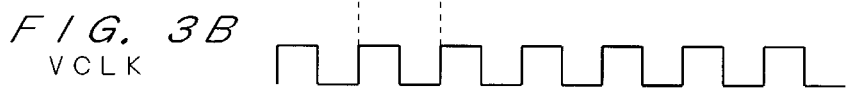
FIG. 3C
ADC SAMPLING
(PHASE VALUE 0)
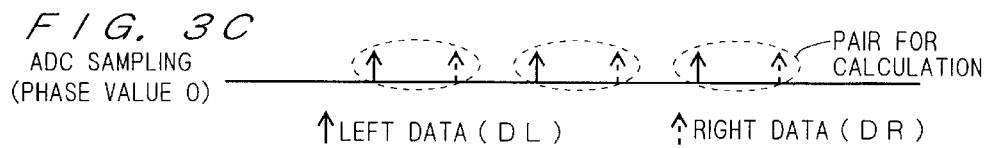
FIG. 3D
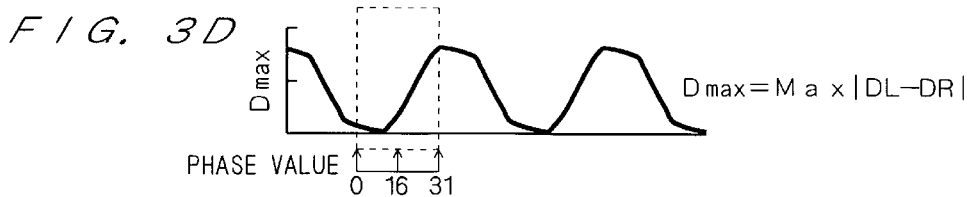

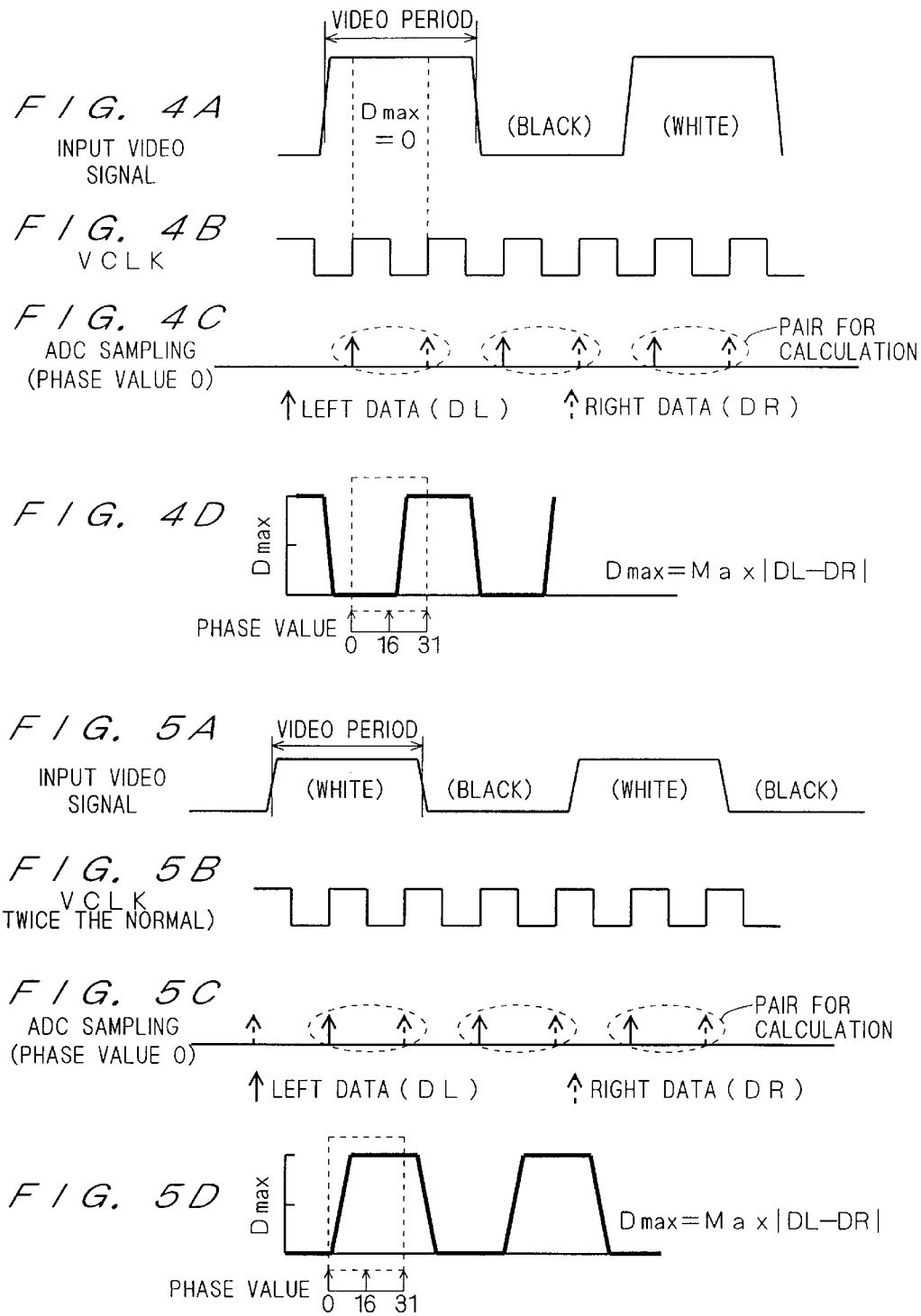

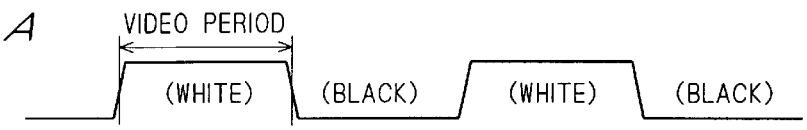
FIG. 6A INPUT VIDEO SIGNAL
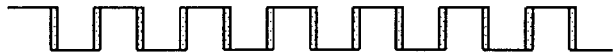
FIG. 6B VCLK (10% JITTER)
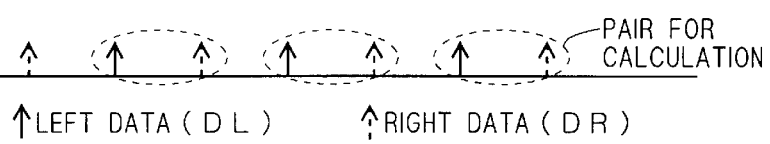
FIG. 6C ADC SAMPLING (PHASE VALUE 0)
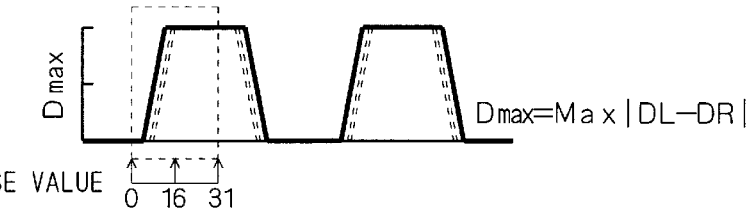
FIG. 6D
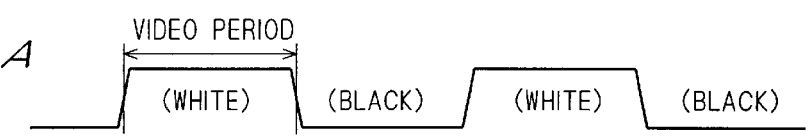
FIG. 7A INPUT VIDEO SIGNAL
FIG. 7B VCLK (20% JITTER)
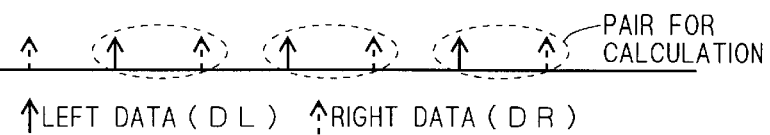
FIG. 7C ADC SAMPLING (PHASE VALUE 0)
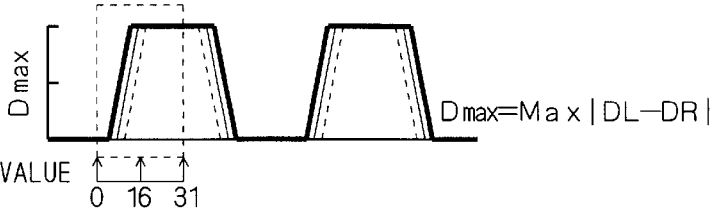
FIG. 7D

INPUT VIDEO SIGNAL

VCLK
(40% JITTER)

ADC SAMPLING
(PHASE VALUE 0)

FIG. 10A
INPUT DATA (WHITE) (BLACK) (WHITE) (BLACK)
FIG. 10B
ADC SAMPLING
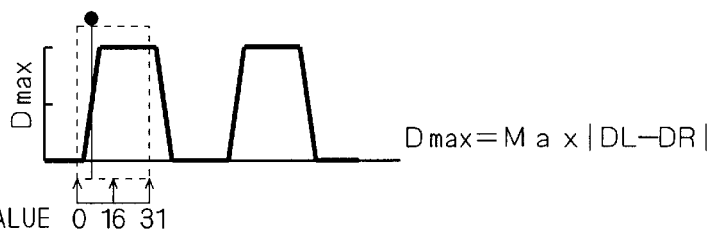
PAIR FOR CALCULATION
↑ LEFT DATA (DL)    ↑ RIGHT DATA (DR)
FIG. 10C
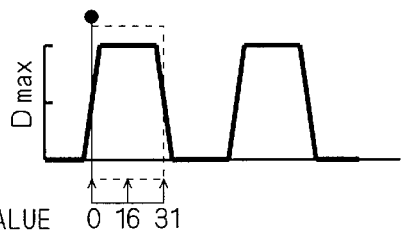
$Dmax = Max|DL-DR|$
PHASE VALUE 0 16 31
FIG. 10D
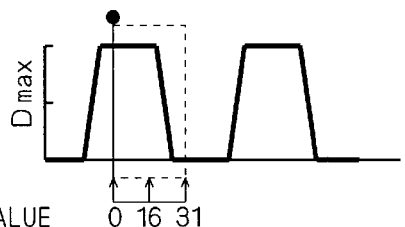
PHASE VALUE 0 16 31
FIG. 10E
PHASE VALUE 0 16 31
FIG. 10F
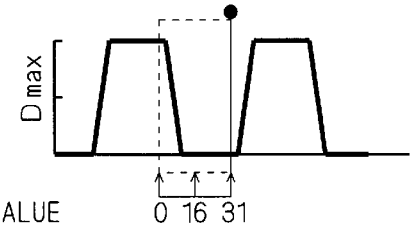
PHASE VALUE 0 16 31
FIG. 10G
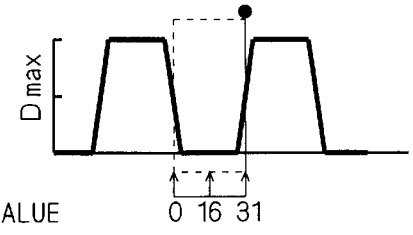
PHASE VALUE 0 16 31

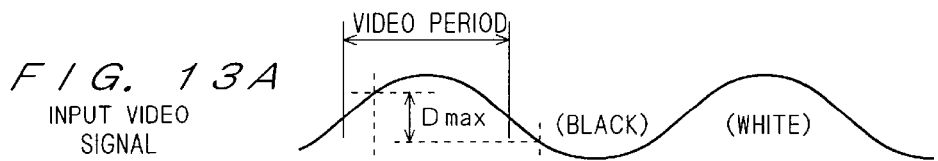
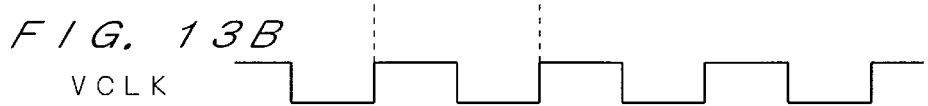
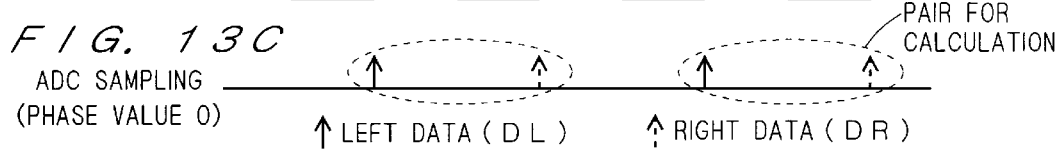
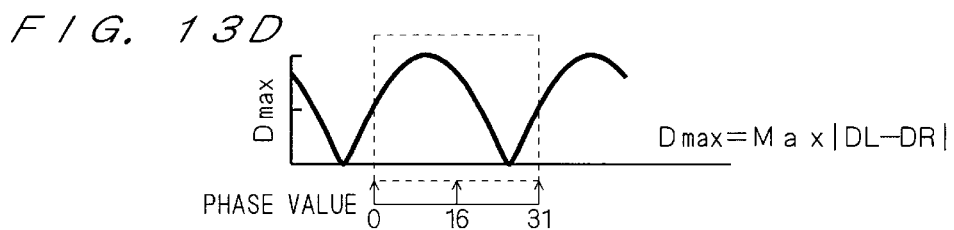
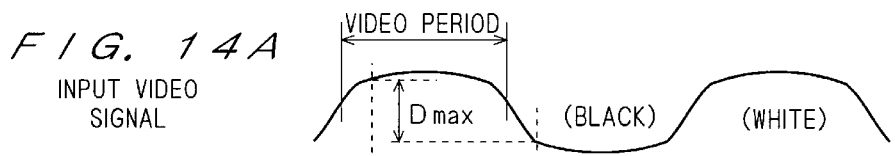
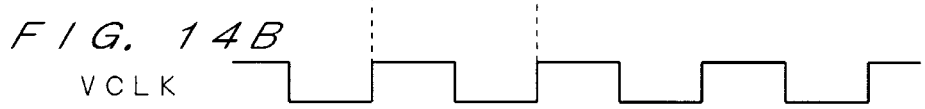
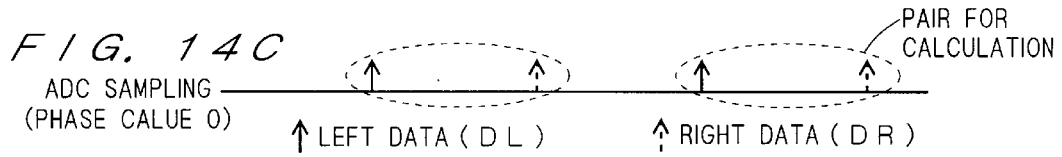
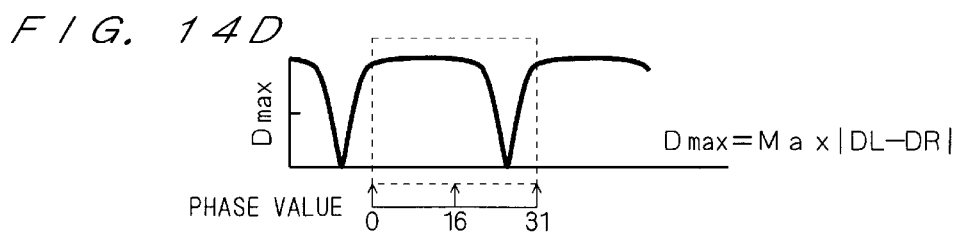

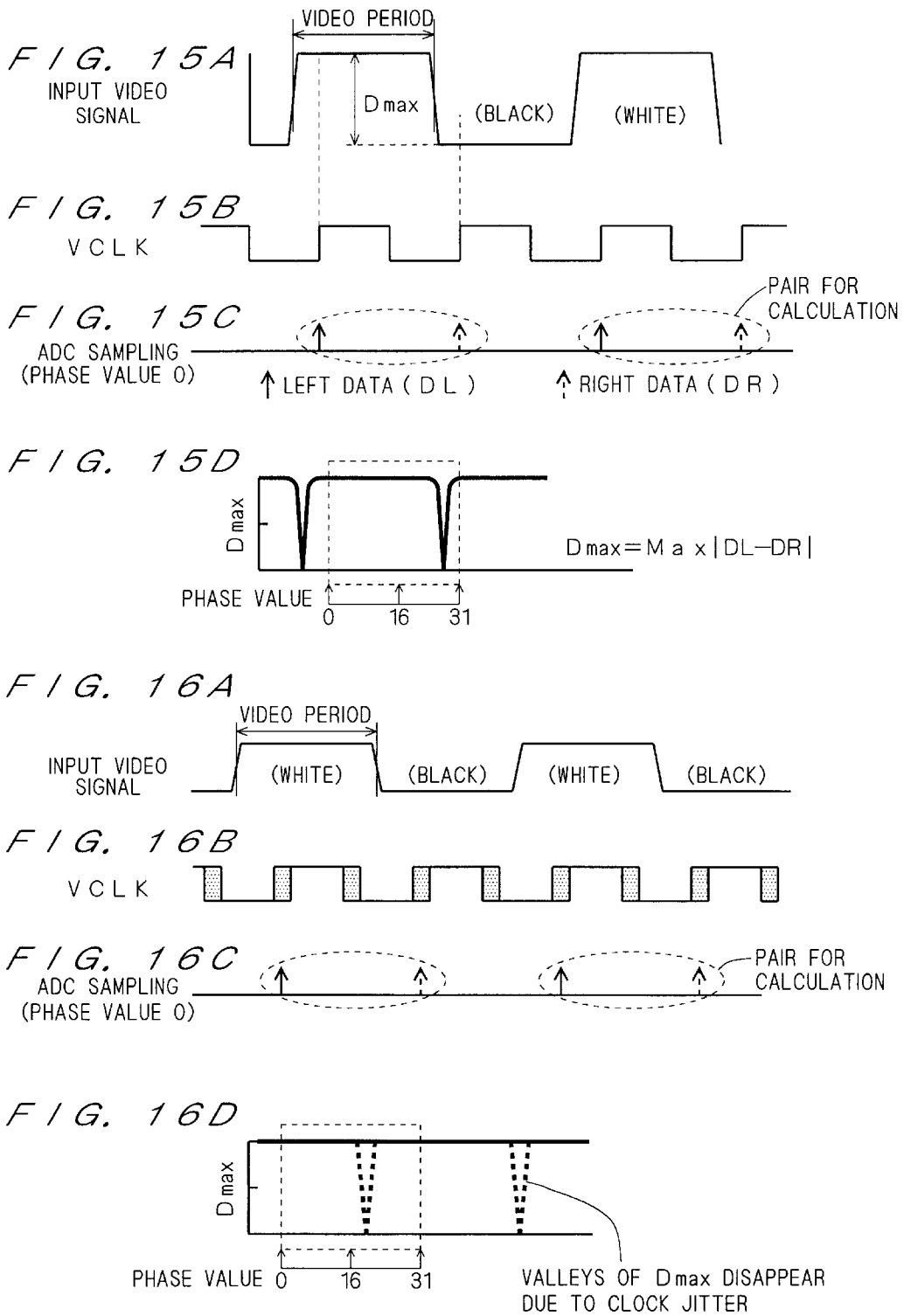

DISPLAY DEVICE

BACKGROUND OF THE INVENTION

1. Field of the Invention

The present invention relates to display devices which automatically adjust the phase of sampling of a video signal, and particularly to improvement for eliminating the effect of jitter appearing in the phase of sampling to realize sampling at a proper phase.

2. Description of the Background Art

FIG. 12 is a block diagram showing the structure of a conventional display device as a background of the invention. This device is disclosed in Japanese Patent Application Laid-Open No. 11-177847 (1999), which is constructed as a liquid crystal display device which automatically adjusts the phase of sampling of an input analog video signal.

The input video signal is converted into digital form in an A/D converter 71. A video signal processing circuit 72 applies gamma correction etc. to the video signal in digital form and also converts the video signal into a proper form for an input signal to a liquid crystal panel 73. A PLL circuit 76 includes a voltage-controlled oscillator (VCO) 77 and a frequency divider 78, which multiplies the horizontal sync signal HD, one of the sync signals inputted with the video signal, to generate a clock having the same period as the video period. The divisional ratio of the frequency divider 78 determines the ratio of multiplication of the generated clock.

A phase correcting circuit 79 corrects the phase of the clock generated by the PLL circuit 76 and supplies a sampling clock VCLK to the A/D converter 71. The A/D converter 71 samples the video signal for digitization in synchronization with the sampling clock VCLK. The video signal digitized by the A/D converter 71 in each period of the sampling clock VCLK (=video period) is alternately referred to as left data DL and right data DR.

An operating unit 80 calculates an absolute difference value ΔD=abs (DL−DR) for every two periods of the sampling clock VCLK; the absolute difference value is the absolute value of a difference between the left data DL and the right data DR. It also calculates a maximum absolute difference value Dmax=Max(ΔD) which is a maximum value of the absolute difference values ΔD in one frame. The sign "abs ( )" represents the absolute value.

A CPU 81 has a comparator 82 for comparing the maximum absolute difference values Dmax and a control circuit 83 for controlling the phase correcting circuit 79 on the basis of the result of the comparison to maximize the maximum absolute difference value Dmax. The control circuit 83 also serves to set the ratio of multiplication of the PLL circuit 76 in accordance with the format of the input video signal (e.g. VGA format etc.)

A timing generating circuit 74 generates a horizontal reference signal and a vertical reference signal indicating the starting points of horizontal and vertical scans on the basis of the sampling clock VCLK, horizontal sync signal HD and vertical sync signal VD. A liquid crystal driving circuit 75 generates a driving signal for driving the liquid crystal panel 73. The liquid crystal panel 73 receives the driving signal from the liquid crystal driving circuit 75 and the video signal from the video signal processing circuit 72 and displays the picture represented by the video signal.

FIGS. 13A to 13D, 14A to 14D and 15A to 15D are explanation diagrams illustrating the operation of adjusting the phase of the sampling clock VCLK. In these explanation diagrams, it is assumed for the sake of simplicity that the video signal represents an image pattern which alternately varies for each pixel as white, black, white, black . . . It is also assumed that the phase correcting circuit 79 can vary the phase of the clock within a variable-phase range of 0 to 360° corresponding to the video period and in 32 steps from setting 0 to setting 31. In these diagrams, "ADC sampling" shows the timing of sampling by the A/D converter 71.

FIGS. 13A to 13D show the characteristic of the maximum absolute difference value Dmax exhibited when the input video signal has a waveform close to a sine wave, FIGS. 14A to 14D show that exhibited when the input video signal has a waveform intermediate between a sine wave and a rectangular wave, and FIGS. 15A to 15D show that exhibited when the input video signal has a waveform close to a rectangular wave. It is assumed that the sampling clock VCLK and the video signal are in the phase relation shown in the diagrams when the phase value or the phase correction value set in the phase correcting circuit 79 is zero (that is, when the amount of delay by correction is 0°). The general principle of the description below is applicable whatever the phase relation is.

When the input video signal is close to a sine wave (FIGS. 13A to 13D), the maximum absolute difference value Dmax varies in upwardly convex curves as the phase value varies, where the phase value at the maximum corresponds to the optimum value and the phase value at the minimum corresponds to the worst value. As the video signal approaches a rectangular wave (FIGS. 14A to 14D and 15A to 15D), the maximum absolute difference value Dmax holds a maximum or nearby value in a wider range of the phase value. Accordingly, the optimum phase value is preferably obtained by detecting the worst value, i.e. a phase value at which the maximum absolute difference value Dmax becomes minimum, and setting the opposite phase shifted by 180° from the worst value as the optimum phase value.

The conventional display device shown in FIG. 12 operates as explained above to automatically optimize the phase of sampling of the input analog video signal.

However, due to the effect of general frequency characteristic of the circuit, the input video signal approaches a sine wave as the video frequency (the reciprocal of the video period) becomes higher and approaches a rectangular wave as it becomes lower. Further, clock jitter usually appears in the clock outputted from the PLL circuit 76, which becomes larger as the video frequency becomes lower. Accordingly, when the video frequency is low, it is difficult to find the optimum phase value in the conventional display device of FIG. 12.

FIGS. 16A to 16D are explanation diagrams showing this problem, which shows an example of the characteristic of the maximum absolute difference value Dmax with a clock including jitter of 10%. As shown in FIGS. 16A to 16D, due to the effect of the jitter, the valleys of the maximum absolute difference value Dmax disappear and the maximum absolute difference value Dmax maintains a constant value almost in the whole range of the phase value. Then the optimum phase value cannot be found. Such effect of jitter becomes more serious as the video frequency becomes lower.

SUMMARY OF THE INVENTION

The present invention has been made to solve the aforementioned problem of conventional devices, and an object of the invention is to obtain a display device which can eliminate the effect of jitter appearing in the phase of sampling of the video signal so as to realize sampling at a proper phase regardless of the video frequency.

According to a first aspect of the present invention, a display device comprises: a sampling portion for sampling a video signal at a rate of a half period which is ½ times a video period of the video signal; a selecting portion for outputting as a display signal every other sampled signal which is the video signal sampled at the rate of the half period; a phase adjusting portion for adjusting the phase of the sampling performed by the sampling portion within a given variable-phase range; an absolute difference value calculating portion for calculating an absolute difference value which is, when the sampled signals are numbered with respect to one of the sampled signals in order of sampling time, the absolute value of a difference between an odd-numbered sampled signal and the next even-numbered sampled signal; a maximum absolute difference value calculating portion for calculating a maximum absolute difference value which is a maximum value in a plurality of the absolute difference values; and a phase control portion for controlling the phase adjusting portion under the restriction of the variable-phase range so that the display signal comprises the sampled signals sampled at a phase which is the closest to a phase set at or near the center of a rising transition in which the maximum absolute difference value increases as the phase delays.

Preferably, according to a second aspect, in the display device, the phase control portion adopts as the phase set at or near the center of a rising transition a phase with which the maximum absolute difference value increases past a given threshold or a phase shifted by the half period from a phase with which the maximum absolute difference value decreases past the given threshold.

Preferably, according to a third aspect, in the display device, the phase adjusting portion adopts the half period as the variable-phase range.

Preferably, according to a fourth aspect, in the display device, the selecting portion comprises a data switching portion capable of freely making a selection between the odd-numbered sampled signal and the even-numbered sampled signal, and the phase control portion controls the data switching portion as well as the phase adjusting portion so that the display signal comprises the sampled signals sampled at a phase which is the closest to the phase set at or near the center of the rising transition made as the phase delays.

Preferably, according to a fifth aspect, in the display device, the phase adjusting portion adopts the video period as the variable-phase range.

Preferably, according to a sixth aspect, in the display device, when the video period is larger than a given value, the phase control portion adopts as the phase set at or near the center of the rising transition a value which is corrected to reduce or cancel a displacement of the phase at the center of the rising transition on the basis of a known relation between the displacement and the magnitude of jitter occurring in the phase of the sampling.

Preferably, according to a seventh aspect, in the display device, the phase adjusting portion comprises a PLL circuit for multiplying a sync signal inputted together with the video signal to generate a clock which completes one cycle in the half period and a phase correcting circuit for correcting a phase of the clock generated by the PLL circuit within the variable-phase range and outputting the clock as a sampling clock, and the sampling portion samples the video signal in synchronization with the sampling clock.

According to the device of the first aspect, the video signal is sampled in a half period and the sampled signals sampled at a phase which is the closest to a phase set in or near the center of a rising transition are outputted as a display signal. The operation of searching for the phase set in or near the center of a rising transition is not hindered even if jitter appears in the sampling phase, so that the sampling can be done at a proper phase without being affected by the jitter.

According to the device of the second aspect, the phase set at or close to the center of a rising transition is determined on the basis of a comparison between the maximum absolute difference value and a given threshold, so that the structure of the phase control portion can be simplified.

According to the device of the third aspect, the phase adjusting portion adjusts the phase within the half period, so that a proper phase can always be obtained as the phase of the display signal.

According to the device of the fourth aspect, the selecting portion comprises a data switching portion which can freely select odd-numbered or even-numbered sampled signals and the phase control portion controls the data switching portion as well as the phase adjusting portion. Accordingly, despite the fact that the variable-phase range is the half period, an optimum phase coinciding with the phase set at or near the center of the rising transition can always be obtained as the phase of the display signal.

According to the device of the fifth aspect, the phase adjusting portion adjusts the phase within the range of the video period, so that an optimum phase coinciding with the phase set at or near the center of a rising transition can always be obtained as the phase of the display signal.

According to the device of the sixth aspect, when the video period is larger than a given value, a value corrected to reduce or cancel a displacement of the center-of-transition phase caused by jitter is adopted as the phase set at or near the center of a rising transition, so that a more proper sampled signal can be obtained as the display signal when jitter has a relatively serious effect.

According to the device of the seventh aspect, the phase adjusting portion is simply constructed using a PLL circuit and a phase correcting circuit.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2A to 2D, 3A to 3D, 4A to 4D, 5A to 5D, 6A to 6D, 7A to 7D and 8A to 8D are diagrams used to explain operation of the device of the first preferred embodiment.

FIGS. 10A to 10G are diagrams used to explain operation of the device of the second preferred embodiment.

FIGS. 13A to 13D, 14A to 14D, 15A to 15D and 16A to 16D are diagrams used to explain operation of the conventional device.

DESCRIPTION OF THE PREFERRED EMBODIMENTS

First Preferred Embodiment

A first preferred embodiment of the present invention is now described.

Device Structure

Figure 1:
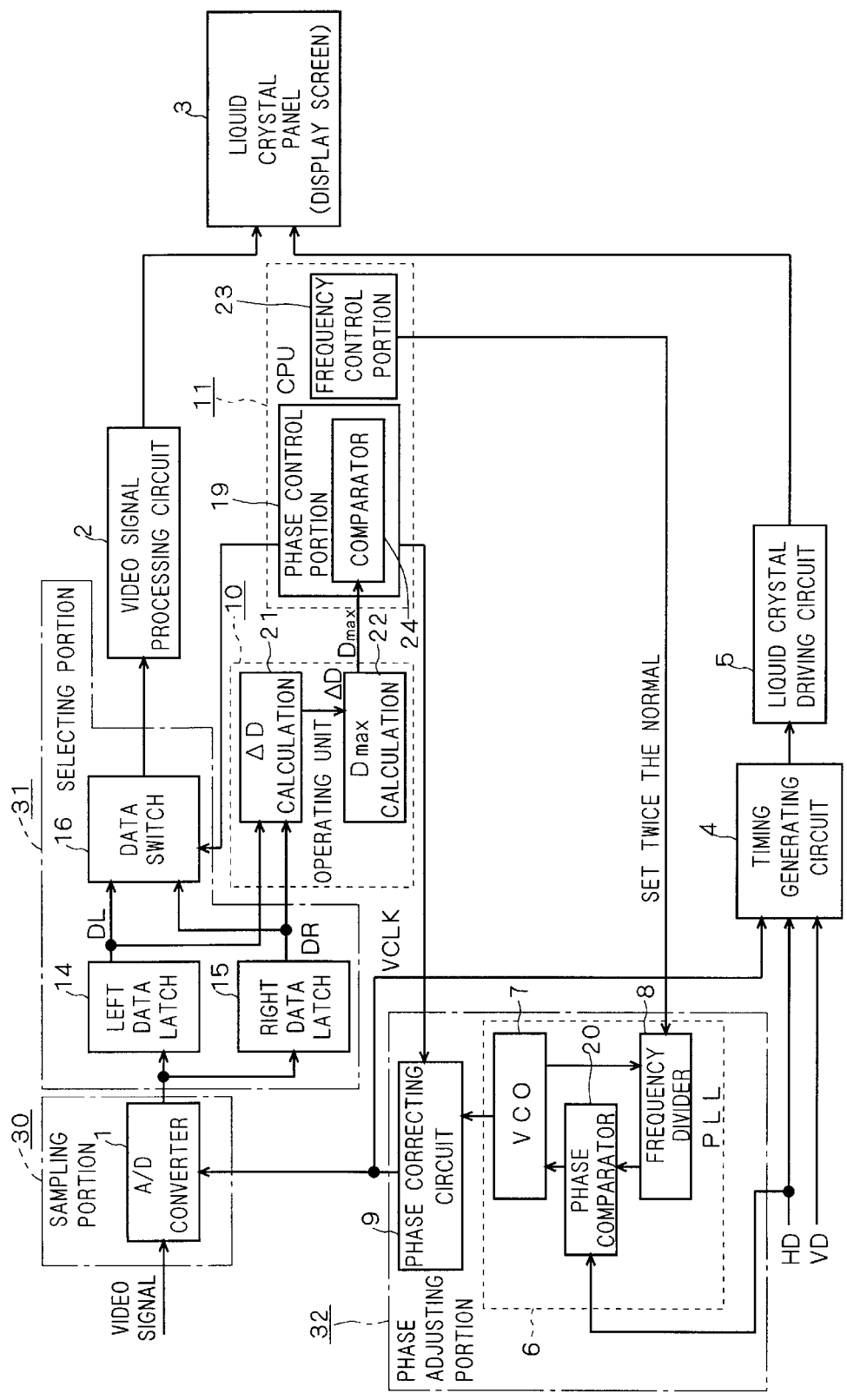
FIG. 1 is a block diagram showing a device according to a first preferred embodiment.
Figure 8A:
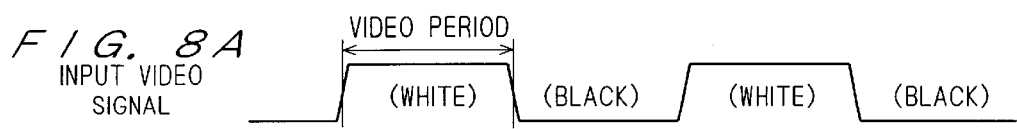
Figure 8B:
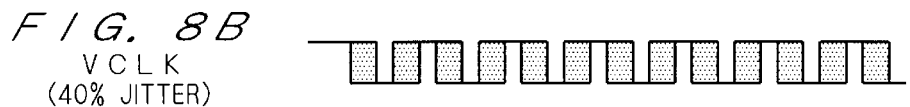
Figure 8C:
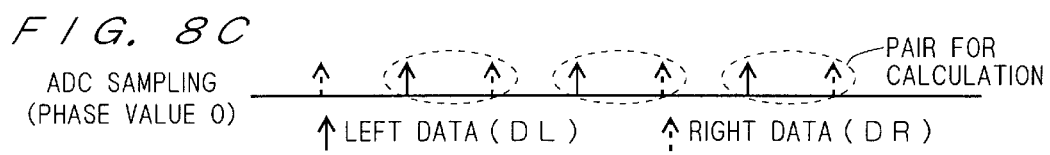
Figure 8D:
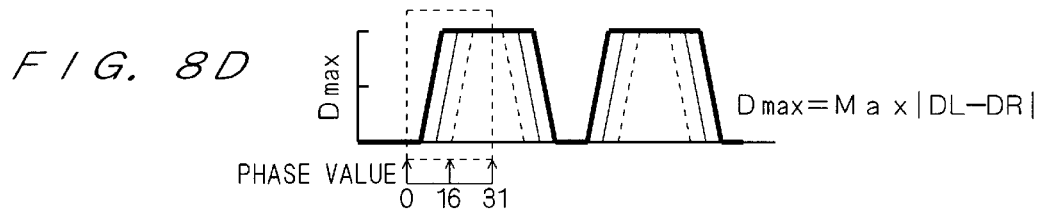

FIG. 1 is a block diagram showing the structure of a display device according to a first preferred embodiment. This device is constructed as a liquid crystal display device which receives an analog video signal.

A PLL circuit 6 includes a voltage-controlled oscillator (VCO) 7, a frequency divider 8, and a phase comparator 20, which multiplies the horizontal sync signal HD, one of the sync signals inputted with the input video signal, to generate a clock having a period which is ½ times the video period (referred to as "half period" herein), or a clock having a frequency twice the video frequency (referred to as "double frequency" herein).

The divisional ratio of the frequency divider 8 is controlled by a frequency control portion 23 equivalently provided in the CPU 11 described later, whereby the ratio of multiplication of the clock is set. A phase correcting circuit 9 corrects the phase of the clock generated by the PLL circuit 6 within a given variable-phase range and supplies a sampling clock VCLK to the A/D converter 1 and other components. The sampling clock VCLK functions as a system clock of the display device. The variable-phase range of the phase correcting circuit 9 is set equal to the half period, i.e. the period of the sampling clock VCLK.

The A/D converter 1 samples the input analog video signal in synchronization with the sampling clock VCLK and provides output in digital form. The sampled signals or the digital video signal obtained from the A/D converter 71 in each half period is alternately referred to as left data DL and right data DR herein. When the sampled signals are numbered with respect to one sampled signal in order of sampling time, the left data DL and the right data DR respectively correspond to odd-numbered and even-numbered sampled signals. The left data DL and the right data DR are held respectively in a left data latch 14 and a right data latch 15 which alternately hold the input signals in synchronization with the sampling clock VCLK.

A data switching portion 16 selects the left data DL held in the left data latch 14 or the right data DR held in the right data latch 15 under control by a phase control portion 19 in the CPU 11 described later and sends the data as a display signal to a video signal processing circuit 2. The video signal processing circuit 2 applies gamma correction etc. to the display signal and converts the signal into a proper form for an input signal to the liquid crystal panel 3 as a display screen.

In an operating unit 10, a difference value calculating portion 21 receives the left data DL held in the left data latch 14 and the right data DR held in the right data latch 15, or the sampled signal following immediately after the left data DL; it then calculates an absolute difference value ΔD=abs (DL−DR), or the absolute value of a difference between them, in every two periods of the sampling clock VCLK (i.e. for each video period). A maximum absolute difference value calculating portion 22 in the operating unit 10 calculates a maximum absolute difference value Dmax=Max (ΔD) which is a maximum value of the absolute difference values ΔD in a certain range, e.g. in one frame.

The CPU 11 is a device component which operates according to a procedure defined by a program, which equivalently includes a phase control portion 19 and a frequency control portion 23: the phase control portion 19 controls the phase correcting circuit 9 and the data switching portion 16 on the basis of the maximum absolute difference value Dmax so that a sampled signal sampled at a proper phase is outputted as the display signal from the data switching portion 16 and the frequency control portion 23 controls the divisional ratio of the frequency divider 8. The operation of the phase control portion 19 will be fully described later.

The frequency control portion 23 controls the divisional ratio of the frequency divider 8 in accordance with the format of the input video signal (e.g. VGA format etc.) so that a clock having a frequency which is twice the video frequency is generated. The control operation by the frequency control portion 23 is not described in detail herein because it provides control in a conventionally known way.

A timing generating circuit 4 generates a horizontal reference signal and a vertical reference signal indicating the starting points of horizontal and vertical scans on the basis of the sampling clock VCLK, horizontal sync signal HD and vertical sync signal VD. A liquid crystal driving circuit 5 generates a driving signal for driving the liquid crystal panel 3. The liquid crystal panel 3 receives the driving signal from the liquid crystal driving circuit 5 and the video signal from the video signal processing circuit 2 and displays the picture represented by the video signal.

The A/D converter 1 is included in a sampling portion 30 of the invention, the left data latch 14, right data latch 15 and data switching portion 16 are included in a selecting portion 31, and the PLL circuit 6 and phase correcting circuit 9 are included in a phase adjusting portion 32. More general embodiments of the sampling portion 30, selecting portion 31 and phase adjusting portion 32 will be described later in modifications.

Device Operation

FIGS. 2A to 2D, 3A to 3D and 4A to 4D are explanation diagrams illustrating the operation to adjust the phase of the sampling clock VCLK. In these explanation diagrams, as in FIGS. 13A to 13D, 14A to 14D, 15A to 15D and 16A to 16D, it is assumed for simplicity that the video signal represents an image pattern which alternately varies for each pixel as white, black, white, black .... However, generally, the same result is obtained as long as the absolute difference values ΔD from which the maximum absolute difference value calculating portion 22 calculates the maximum absolute difference value Dmax include an absolute difference value of white and black. For example, when a maximum value of absolute difference values ΔD in one frame is calculated as the maximum absolute difference value Dmax, it works as long as adjacent white and black exist once in one frame.

In FIGS. 2A to 2D, 3A to 3D and 4A to 4D, it is assumed that the phase correcting circuit 9 can vary the phase of the clock in a variable-phase range of 0 to 360° corresponding to the period of the sampling clock VCLK and in 32 steps from setting 0 to setting 31 (i.e. in the range of 0 to 348.750°).

FIGS. 2A to 2D, 3A to 3D and 4A to 4D show the characteristic of the maximum absolute difference value Dmax, where the input video signal has a waveform close to a sine wave in FIG. 2A, a waveform intermediate between a sine wave and a rectangular wave in FIG. 3A, and a waveform close to a rectangular wave in FIG. 4A. It is assumed that the sampling clock VCLK and the video signal are in the phase relation shown in the diagrams when the phase value or the phase correction value set in the phase correcting circuit 9 is zero (that is, when the amount of delay by correction is 0°). The general principle of the description below is applicable whatever the phase relation is.

Figure 12:
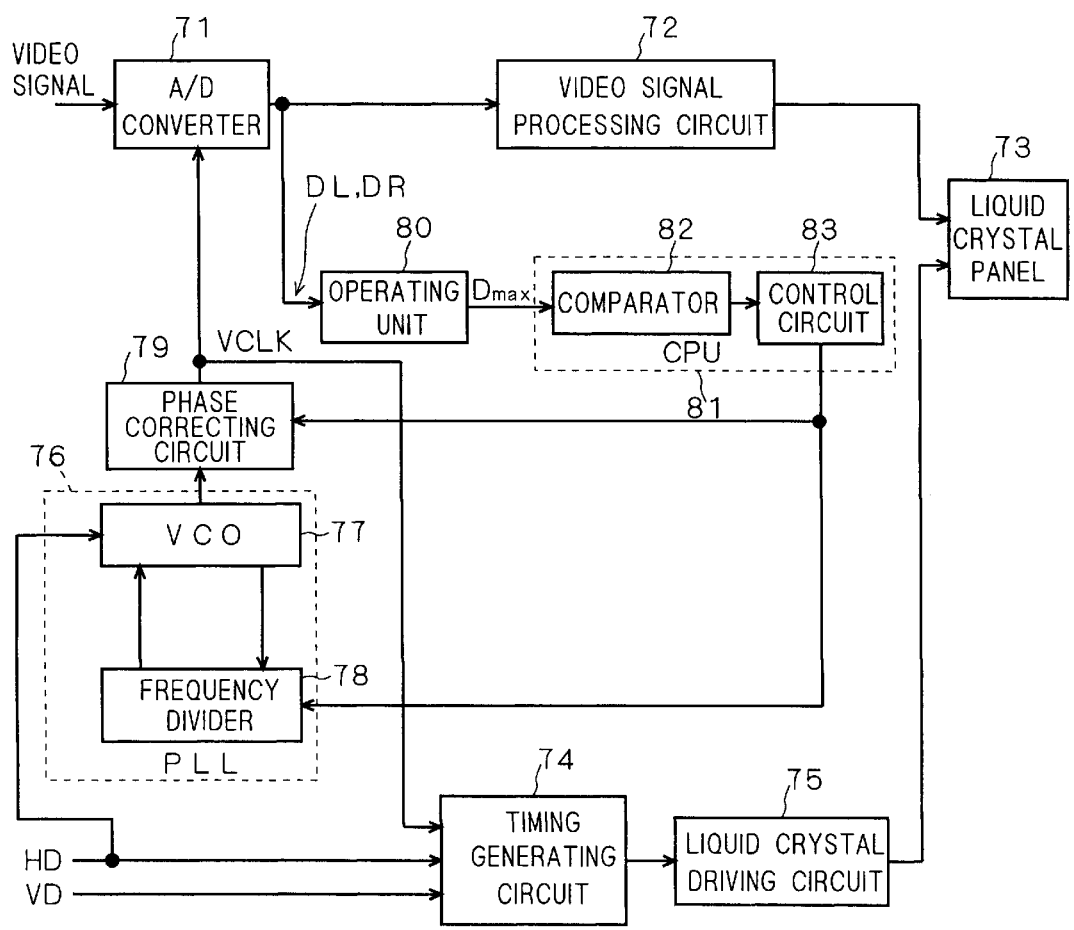
FIG. 12 is a block diagram showing a conventional device.

When a maximum value of the absolute difference values ΔD in one frame is calculated as the maximum absolute difference value Dmax, the characteristic of the maximum absolute difference value Dmax is obtained by varying the step of the phase value for each frame. In this case, obtaining the characteristic of the maximum absolute difference value Dmax requires a time equal to 32×period of the vertical sync signal VD. This also applies to the conventional device shown in FIG. 12. The operation of obtaining the characteristic of the maximum absolute difference value Dmax is performed when the period of the horizontal sync signal HD or vertical sync signal VD changes, such as when the format of the input video changes.

As shown in FIGS. 2A to 2D, 3A to 3D and 4A to 4D, as the waveform of the input video signal becomes closer to a rectangular wave, the waveform of the maximum absolute difference value Dmax also becomes closer to a rectangular wave and the rise and fall of the maximum absolute difference value Dmax therefore become sharper. Further, as has been already stated, the waveform of the video signal becomes closer to a sine wave as the video frequency becomes higher, and it becomes closer to a rectangular wave as the video frequency becomes lower.

However, as shown in FIGS. 2A to 2D, 3A to 3D and 4A to 4D, independently of the waveform of the input video signal, the phase value at the center of a rising transition in which the maximum absolute difference value Dmax increases as the phase value increases (as the phase delays) is located at the center of the pixel of the input video signal. On the other hand, the phase value at the center of a falling transition in which the maximum absolute difference value Dmax decreases as the phase value increases is located at the boundary between the pixels of the input video signal. The phase at the center of a transition is the middle value between the phase at the upper end of the transition and the phase at the lower end.

Accordingly, when the phase value is set at the phase value at the center of a rising transition, the left data DL is the optimum sampled signal. On the other hand, when the phase value is set at the phase value at the center of a falling transition, the right data DR is the optimum sampled signal. The phase control portion 19 controls the phase correcting circuit 9 so that the phase value is set at one of them depending on which of a rise and fall of the maximum absolute difference value Dmax appears within the variable-phase range of the phase value. It also controls the data switching portion 16 to select the left data DL or right data DR. Thus the data switching portion 16 can always output as the display signal an optimum sampled signal which was sampled at a phase corresponding to the center of the rising transition.

While the optimum phase value is thus the phase value at the center of a transition, a phase value in the vicinity of the center of the transition within a certain range can be selected instead. A sufficiently proper image can be obtained also in this case and the object of the invention can be achieved. For example, a phase value at which the maximum absolute difference value Dmax increases or decreases passing a certain threshold may be selected as an approximate value of the center-of-transition phase value. In the display device shown in FIG. 1, the phase control portion 19 includes a comparator 24 which compares the maximum absolute difference value Dmax with a given threshold. The phase control portion 19 controls the phase value of the phase correcting circuit 9 and the selecting operation performed by the data switching portion 16 on the basis of an output from the comparator 24.

Since the display device of this preferred embodiment operates as shown in FIGS. 2A to 2D, 3A to 3D and 4A to 4D, it is possible, even if jitter appears in the sampling clock VCLK, to obtain a proper sampled signal without being affected by the jitter. FIGS. 5A to 5D, 6A to 6D, 7A to 7D and 8A to 8D are explanation diagrams showing this. FIGS. 5A to 5D show an example with no jitter, FIGS. 6A to 6D show an example with jitter of 10%, FIGS. 7A to 7D show an example with jitter of 20%, and FIGS. 8A to 8D show an example with jitter of 40%.

In FIGS. 6A to 6D, 7A to 7D and 8A to 8D where clock jitter exists, the outer trace of the curves drawn considering the jitter (the waveform showing the maximum values of all curves) gives the waveform of the maximum absolute difference value Dmax, since a maximum value of the absolute difference values ΔD in one frame, for example, is calculated as the maximum absolute difference value Dmax. This locus is traced by a thick line. Thus, considering a rising transition, the phase value at the center of the transition shifts to lower phase values (in the direction in which the phase advances) as the jitter becomes larger.

As shown in FIGS. 8A to 8D, however, it is still possible to find the phase value at the center of a transition even if the jitter becomes as large as 40%, and the magnitude of the displacement is as small as 10% of the video period. Hence a proper sampled signal can be obtained as the display signal. The display device of the first preferred embodiment can thus eliminate the effect of jitter and obtain a proper sampled signal.

The relation between the video frequency and the magnitude of jitter can be found in advance, and then the frequency control portion 23 can be constructed to further apply a correction to the phase value in accordance with the video frequency so as to reduce/cancel the displacement. This enables provision of a more proper sampled signal. Since this processing provides a remarkable effect especially when the video frequency is lower (i.e. when the video period is larger), the frequency control portion 23 may be constructed to perform this processing only when the frequency of the sampling clock VCLK is lower than a given value (i.e. when the video period is larger than a given value).

Second Preferred Embodiment

Figure 9:
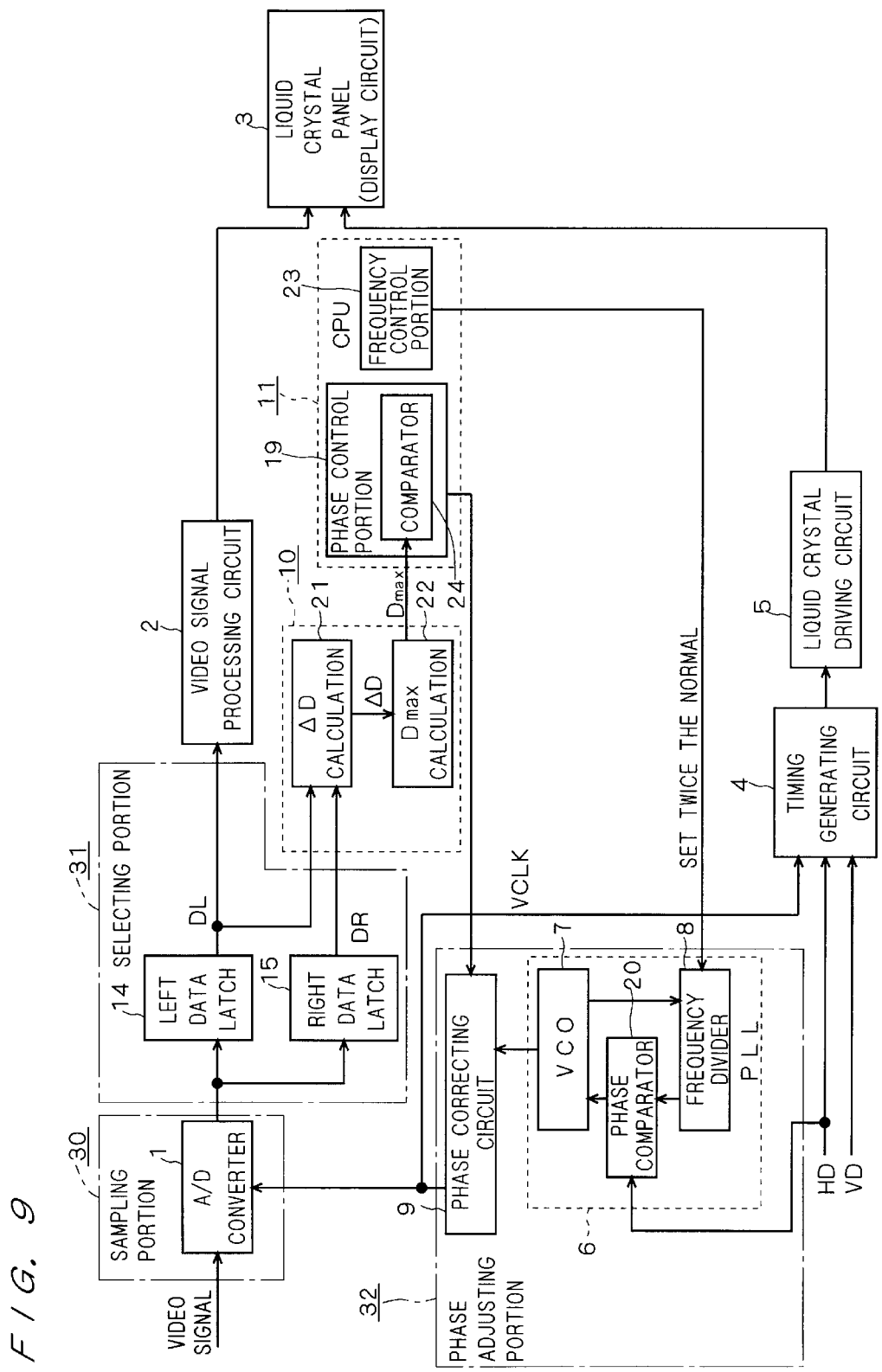
FIG. 9 is a block diagram showing a device according to a second preferred embodiment.

FIG. 9 is a block diagram showing the structure of a display device according to a second preferred embodiment. This device characteristically differs from the display device shown in FIG. 1 in the first preferred embodiment in that the data switching portion 16 is omitted and that the left data DL outputted from the left data latch 14 is fixedly inputted to the video signal processing circuit 2. In contrast to that in the first preferred embodiment, the left data DL is always selected as the display signal, so that a value which is the closest, within the variable-phase range, to the phase at the center of a rising transition or to its approximate value is selected as the phase value set by the phase correcting circuit 9.

FIGS. 10A to 10G are an explanation diagrams showing the operation to adjust the phase of the sampling clock VCLK. For simplicity, as in FIGS. 13A to 13D, 14A to 14D, 15A to 15D and 16A to 16D, it is assumed also in FIGS. 10A to 10G that the video signal represents an image pattern which alternately varies for each pixel as white, black, white, black . . . . It is also assumed that the phase correcting circuit 9 can vary the phase of the clock in the variable-phase range of 0 to 360° corresponding to the period of the sampling clock VCLK and in 32 steps from setting 0 to setting 31 (i.e. in the range of 0 to 348.750).

FIG. 10C is a graph showing an example in which the center of a rising transition of the maximum absolute difference value Dmax is contained in the variable-phase range. In this case, a phase value at or near the center of the rising transition is selected as the phase value set by the phase correcting circuit 9. The black dot in the diagram shows the selected phase value.

FIG. 10D is a graph showing an example in which the maximum absolute difference value Dmax holds a high value over the entire variable-phase range. In this case, the center of the rising transition is located on the minus side of the phase value zero, so that zero is selected as the phase value set by the phase correcting circuit 9.

FIG. 10E is a graph showing an example in which the center of a falling transition is located in a range higher than the center of the variable-phase range (=180° or the value in the sixteenth step). In this case, the center of the rising transition is close to the phase value zero, so that zero is selected as the phase value set by the phase correcting circuit 9.

FIG. 10F is a graph showing an example in which the center of a falling transition is located in a range lower than the center of the variable-phase range. In this case, the center of the rising transition is close to the phase value 360° (or the value in the thirty-first step), so that 360° (or the value in the thirty-first step) is selected as the phase value set by the phase correcting circuit 9.

FIG. 10G is a graph showing an example in which the maximum absolute difference value Dmax holds a low value over the entire variable-phase range. In this case, the center of the rising transition is located on the plus side of the phase value 360° (or the value in the thirty-first step), so that 360° (or the value in the thirty-first step) is selected as the phase value set by the phase correcting circuit 9.

As stated in the first preferred embodiment, an approximate value of the center of a transition can be used instead. Accordingly, as shown in FIG. 9, the phase control portion 19 may contain the comparator 24. The comparator 24 sets a threshold and outputs an "L" level when the input maximum absolute difference value Dmax is lower than the threshold and outputs an "H" level when it is higher than the threshold.

When the output of the comparator 24 varies from the "L" level to "H" level at a certain phase value as the phase value increases, the phase control portion 19 determines that the waveform of the maximum absolute difference value Dmax belongs to the pattern of FIG. 10C. When the output stays at the "H" level throughout the variable-phase range, it determines that the waveform is in the pattern of FIG. 10D. When the output changes from the "H" level to "L" level at a certain phase value, it determines that the waveform is in the pattern of FIG. 10E or FIG. 10F, and it determines that it is in the pattern of FIG. 10G when the output stays at the "L" level throughout the variable-phase range. In the case of the pattern of FIG. 10E or FIG. 10F, it compares the phase value at which the output varies from the "H" level to "L" level with 180° or the value in the sixteenth step to determine which of the patterns of FIG. 10E and FIG. 10F it corresponds to.

The variable-phase range of the phase value of the phase correcting circuit 9 can be set wider to two periods of the sampling clock VCLK, i.e. to the video period. In this case, the center of a rising transition of the maximum absolute difference value Dmax is always contained within the variable-phase range. Accordingly it is possible to always select the phase value at the center of a rising transition as the phase value set by the phase correcting circuit 9, thus providing a more proper sampled signal as the display signal. Also in this case, an approximate value may be used instead of the phase value at the center of the rising transition.

Third Preferred Embodiment

Figure 11:
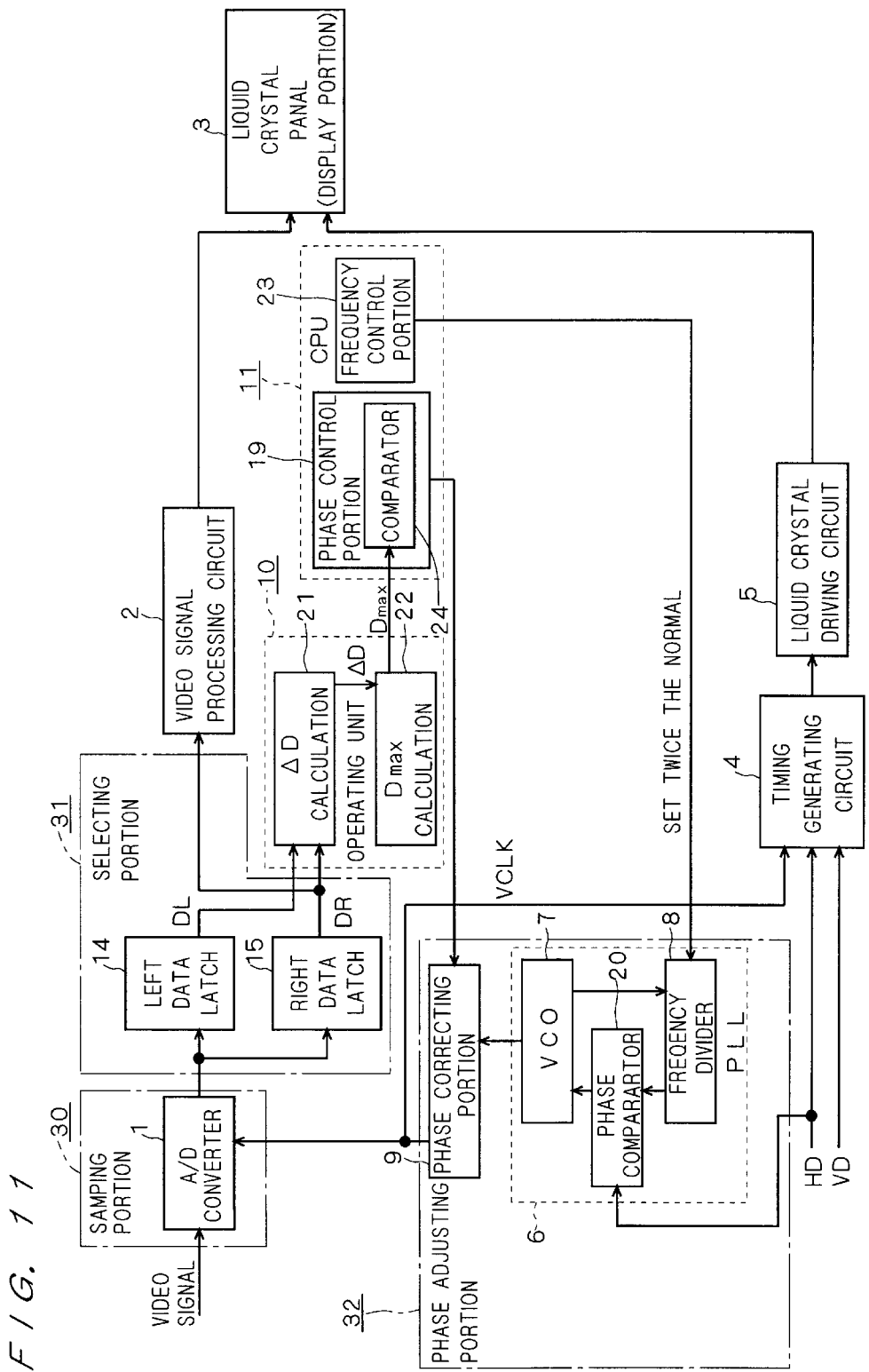
FIG. 11 is a block diagram showing a device according to a third preferred embodiment.

FIG. 11 is a block diagram showing the structure of a display device according to a third preferred embodiment. This device characteristically differs from the display device shown in FIG. 9 in the second preferred embodiment in that the right data DR outputted from the right data latch 15 is fixedly inputted to the video signal processing circuit 2.

The right data DR is always selected as the display signal, so that a value which is the closest to the phase at the center of a falling transition or to its approximate value in the variable-phase range is selected as the phase value set by the phase correcting circuit 9. As a result, as in the second preferred embodiment, a sampled signal which is sampled at a phase at or near the center of a rising transition is obtained as the display signal.

That is to say, when the variable-phase range is set to one period of the sampling clock VCLK, the phase value is controlled in a manner in which the rising transition and falling transition are exchanged in FIGS. 10C to 10G. When the variable-phase range is set to two periods of the sampling clock VCLK, the phase value at the center of a falling transition or its approximate value is selected as the phase value set by the phase correcting circuit 9.

Modifications (1) The phase control portion 19 and the frequency control portion 23 may be formed with hardware, instead of being equivalently formed by the CPU 11 operating with a program. Other elements in the display device, such as the elements in the selecting portion 31 and the operating unit 10 may be equivalently formed as part of the CPU 11. In this specification, the names of the circuits, like operating unit 10, latches 14 and 15, etc. also represent those equivalently formed as part of the CPU in this way.

(2) While the preferred embodiments above have shown liquid crystal display devices by way of example, the display device of the present invention can be applied not only to liquid crystal display devices but also generally to display devices which sample a video signal to adapt it to a display screen displaying the sampled signal for each pixel.

(3) The sampling portion 30, selecting portion 31 and phase value adjusting portion 32 are not limited to those shown in FIGS. 1, 9 and 11; they can take more common forms. For example, the sampling portion 30 may be an element which performs sampling but does not convert a signal into digital form. Digital conversion is not necessary if the display device has a display screen which displays a sampled signal in analog form for each pixel.

The selecting portion 31 may take other form, as long as it outputs as the display signal every other sampled signal provided from the sampling portion 30. The phase value adjusting portion 32 may take other form as long as it adjusts the sampling phase of the sampling portion 30 within a given variable-phase range.

The phase control portion 19 generally controls the phase adjusting portion under the restriction of the variable-phase range so that the display signal is composed of a sampled signal sampled at a phase which is the closest to a phase set at or near the center of a rising transition of the maximum absolute difference value Dmax. The phase control portions 19 in the first to third preferred embodiments are examples thereof.

(4) Instead of calculating a maximum value of the absolute difference values ΔD in one frame as the maximum absolute difference value Dmax, a maximum value in one line may be calculated. More generally, a maximum value of a plurality of absolute difference values ΔD can be calculated. However, calculating a maximum value among absolute difference values ΔD in one frame as the maximum absolute difference value Dmax is advantageous in that a proper phase can be found if adjacent white and black pixels appear once in one frame.

While the invention has been described in detail, the foregoing description is in all aspects illustrative and not restrictive. It is understood that numerous other modifications and variations can be devised without departing from the scope of the invention.

What is claimed is:

1. An apparatus which samples video signals at a calculated phase and provides the sampled signal to a display device, comprising:
    a sampling portion for sampling a video signal at a rate of a half period which is ½ times a video period of the video signal;
    a selecting portion for outputting as a display signal every other sampled signal which is the video signal sampled at the rate of said half period;
    a phase adjusting portion for adjusting the phase of the sampling performed by said sampling portion within a given variable-phase range;
    an absolute difference value calculating portion for calculating an absolute difference value which is, when said sampled signals are numbered with respect to one of said sampled signals in order of sampling time, the absolute value of a difference between an odd-numbered sampled signal and the next even-numbered sampled signal;
    a maximum absolute difference value calculating portion operatively connected to said absolute difference value calculating portion for calculating a maximum absolute difference value which is a maximum value in a plurality of said absolute difference values;
    a phase control portion operatively connected to said maximum absolute difference value calculating portion for controlling said phase adjusting portion under the restriction of said variable-phase range so that said display signal comprises the sampled signals sampled at a phase which is the closest to a phase set at or near the center of a rising transition in which said maximum absolute difference value increases as said phase delays; and
    a video signal processing circuit for processing the display signal and outputting the processed display signal to a display screen.

2. The apparatus according to claim 1, wherein said phase control portion adopts as said phase set at or near the center of a rising transition a phase with which said maximum absolute difference value increases past a given threshold or a phase shifted by said half period from a phase with which said maximum absolute difference value decreases past said given threshold.

3. The apparatus according to claim 1, wherein said phase adjusting portion adopts said half period as said variable-phase range.

4. The apparatus according to claim 3,
    wherein said selecting portion comprises a data switching portion capable of freely making a selection between said odd-numbered sampled signal and said even-numbered sampled signal, and
    said phase control portion controls said data switching portion as well as said phase adjusting portion so that said display signal comprises the sampled signals sampled at a phase which is the closest to said phase set at or near the center of the rising transition made as said phase delays.

5. The apparatus according to claim 1, wherein said phase adjusting portion adopts said video period as said variable-phase range.

6. The apparatus according to claim 1, wherein when said video period is larger than a given value, said phase control portion adopts as said phase set at or near the center of the rising transition a value which is corrected to reduce or cancel a displacement of said phase at the center of the rising transition on the basis of a known relation between said displacement and the magnitude of jitter occurring in the phase of the sampling.

7. The apparatus according to claim 1, wherein said phase adjusting portion comprises,
    a PLL circuit for multiplying a sync signal inputted together with said video signal to generate a clock which completes one cycle in said half period, and
    a phase correcting circuit for correcting a phase of said clock generated by said PLL circuit within said variable-phase range and outputting the clock as a sampling clock,
    and wherein said sampling portion samples said video signal in synchronization with said sampling clock.

8. A method for sampling a video signal at a calculated phase and providing the sampled signal to a display device, comprising the steps of:
    sampling a video signal at a rate of a half period producing a sampled signal;
    outputting every other sampled signal as a display signal;
    adjusting the phase of the sampling within a variable-phase range;
    calculating an absolute difference value determined by the absolute value of a difference between an odd-numbered sampled signal and the next even-numbered sampled signal;
    calculating a maximum absolute difference value determined by the maximum value among a determined plurality of said calculated absolute difference values;
    controlling the phase within said variable-phase range so that said display signal comprises the sampled signals sampled at a phase which is closest to a phase set at or near the center of a rising transition in which said calculated maximum absolute difference value increases as said phase delays; and
    processing the display signal and outputting the processed display signal to a display screen.

* * * * *